United States Patent [19]

Wilhelm et al.

[11] Patent Number: 4,879,530
[45] Date of Patent: Nov. 7, 1989

[54] MONOLITHICALLY INTEGRATABLE PHASE SHIFTER VCO

[75] Inventors: Wilhelm Wilhelm; Winfried Birth, both of Munich, Fed. Rep. of Germany

[73] Assignee: Siemens Aktiengesellschaft, Munich, Fed. Rep. of Germany

[21] Appl. No.: 270,741

[22] Filed: Nov. 14, 1988

[30] Foreign Application Priority Data

Nov. 19, 1987 [DE] Fed. Rep. of Germany ....... 3739210

[51] Int. Cl.$^4$ .................. H03B 5/24; H03B 27/00
[52] U.S. Cl. ............................ 331/45; 331/57; 331/108 B; 331/135; 331/177 R
[58] Field of Search ............. 331/45, 57, 108 B, 111, 331/135, 136, 137, 143, 177 R

[56] References Cited

U.S. PATENT DOCUMENTS

| 3,452,289 | 6/1969 | Ryan | 330/254 |
| 3,708,757 | 1/1973 | Savarese et al. | 331/57 |
| 4,758,740 | 7/1988 | Wilhelm et al. | 307/310 |

FOREIGN PATENT DOCUMENTS 0220454 5/1987 European Pat. Off. .
2053608 2/1981 United Kingdom .

OTHER PUBLICATIONS

IEEE Journal of Solid State Circuits, Feb. 1970, pp. 45–48, New York, U.S.: C. R. Ryan: "Applications of a Four-Quadrant Multiplier", Figures 1 and 2; p. 46, lines 10–21.

German Brochure: "Halbleiter-Schaltungstechnik", Tietzel/Schenk: Springer-Verlag, Berlin, Heidelberg, New York, Tokyo 1985, pp. 335–340.

German Brochure: "Theorie und Entwurf Elektrischer Netzwerke", (Stewart): Berliner Union, Stuttgart 1958; pp. 372–395.

Figure 2:
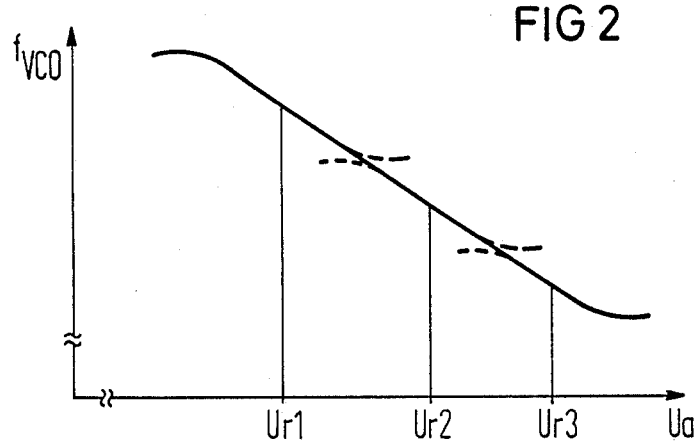

IBM Technical Disclosure Bulletin, vol. 16, No. 11, Apr. 1974, pp. 3498–3500, New York, U.S.; Marino: "Variable Delay Pulse Circuits"; Figure 2, p. 3499, Last Paragraph.

Primary Examiner—Siegfried H. Grimm
Attorney, Agent, or Firm—Herbert L. Lerner; Laurence A. Greenberg

[57] ABSTRACT

A phase shifter VCO has at least first and last fundamental circuits each including an amplifier adding circuit, a control input connected to all of the other control inputs for a tuning potential varying an amplification operative ratio between the first input and the output to the second input and the output of the adding circuit, a reference input for a reference potential, symmetrical first and second non-inverting and inverting circuit input pairs, a symmetrical non-inverting and inverting circuit output pair, and a symmetrical timing element having an input connected to the first circuit input and having an output forming the first input of the adding circuit. The first non-inverting input of the first fundamental circuit is connected to the non-inverting output of the last fundamental circuit, and the first inverting input of the first fundamental circuit is connected to the inverting output of the last fundamental circuit. The non-inverting output of the first fundamental circuit is connected to the first inverting input of the last fundamental circuit and to the second inverting inputs of all of the fundamental circuits, and the inverting signal output of the first fundamental circuit is connected to the first non-inverting input of the last fundamental circuit and to the second non-inverting inputs of all of the fundamental circuits. At least one of the signal outputs of at least one of the fundamental circuits forms a signal output of the phase shifter oscillator.

7 Claims, 2 Drawing Sheets

MONOLITHICALLY INTEGRATABLE PHASE SHIFTER VCO

The invention relates to a monolithically integratable phase shifter oscillator with voltage-dependent frequency (that is, a voltage controlled oscillator or VCO), including fundamental circuits, each having a respective symmetrical first input, a symmetrical second input, a control input, a reference input, and a symmetrical signal output; the first input forming the input of a symmetrical timing element, the output of this timing element being connected to the symmetrical first input of an amplifier adding circuit, the symmetrical second input of each fundamental circuit forming the second input of this amplifier adding circuit, the reference input of each fundamental circuit being able to be acted upon by a reference potential, and the control input of each fundamental circuit being able to be acted upon with a tuning potential, for varying the ratio of the amplification operative between the first input of the amplifier adding circuit and its output to the amplification operative between the second input of the amplifier adding circuit and its output.

The book b J. L. Stewart entitled "Theorie and Entwurf elektrischer Netzwerke" [Theory and Design of Electrical Networks], Chapter 13, particularly pages 387 and 388, discloses phase shifter oscillators in which the output signal of an adding device with a negative sign is fed back through two parallel networks, which differ in their transit time or frequency response, to the inputs of the aforementioned adding device. The frequency of such oscillators can be varied by varying the weighting factors of the signals passing through the various networks A monolithically integratable adding device in which the weighting factors of the two input signals can be varied, especially in opposite directions, by means of a control voltage, is described in U.S. Pat. No. 3,452,289 dated Jun. 24, 1969. That patent relates to an amplifier configuration including a constant current source as well as a lower differential amplifier pair having a first and a second transistor, the emitter terminals of these two transistors being joined to one another and connected to the aforementioned constant current source and the base terminals of these first and second transistors each forming one control signal input. A first upper differential amplifier pair has a third and a fourth transistor, the emitter terminals of these third and fourth transistors being joined and connected to the collector terminal of the first transistor, the base terminal of this third transistor forming a first non-inverting signal input and the base terminal of the fourth transistor forming a first inverting signal input. A second upper differential amplifier pair has a fifth and a sixth transistor, the emitter terminals of the fifth and the sixth transistors being joined and connected to the collector terminal of the second transistor, the base terminal of this fifth transistor forming a second non-inverting input and the base terminal of the sixth transistor forming a second inverting input The collector terminal of the third transistor is joined to the collector terminal of the fifth transistor and both form a first signal output The collector terminal of the fourth transistor is joined to the collector terminal of the sixth transistor and both form a second signal output. The signal of this second signal output is inverse to the signal of the first signal output, and the two signal outputs are connected to an output circuit.

In an article by C. R. Ryan entitled "Applications of a Four-Quadrant Multiplier", which was published in the "IEEE Journal of Solid-State Circuits" of Feb. 1970 on pp. 45–48, a voltage controlled oscillator is shown for generating asymmetrical output signals The oscillator is formed by connecting an output of the above-described circuit, taken from U.S. Pat. No. 3,452,289, to a first RC element, and the output signal of this output, delayed by this first RC element, is connected through a resistor circuit, without further delay, to the second non-inverting input and through a second RC element, which delays the signal, to the first non-inverting input of the circuit A control signal input for varying the oscillator frequency is subjected to a tuning voltage. The inverting signal inputs are connected to the reference potential and the other control signal input is subjected to a constant potential.

In such circuits, the greater the time constant of the first RC element, the lower the frequency of the corresponding oscillator. If the oscillator frequency is lowered in this manner, then the ratio of the maximum VCO frequency to the minimum VCO frequency that can be set through the control signal inputs, in an oscillator circuit that is identical except for the first RC element, is lower for the lower maximum VCO frequency than for the higher maximum VCO frequency corresponding to a shorter time constant of the first RC element The maximum VCO frequency is attained by means of maximal weighting of the fed-back signal delayed by the second RC element and by minimal weighting of the fed-back signal that is not delayed by the resistor network The minimum VCO frequency requires a correspondingly opposed distribution of the weighting factors. With monolithic integration of the circuit shown in the above-described article by C. R. Ryan, the resistors and the capacitors of the RC elements and resistor network in the circuit require a large chip surface area, so that this circuit logically enough cannot be completely monolithically integrated.

An oscillator described in the article by Ryan is distinguished by a low usable variation range of the tuning voltage, and furthermore the output frequency variation is only linearly dependent on the variation of tuning voltage over a relatively narrow range. If the VCO frequency is plotted over the tuning voltage in an orthogonal coordinate system, then for an oscillator of the type described, in accordance with the aforementioned article by Ryan, a frequency/tuning voltage characteristic curve is obtained that is linear within a relatively small frequency range. Moreover, this linear range has a rather steep slope.

However, in many applications, in particular for use in wide-band PLL circuits, a linear relationship between the tuning voltage and the VCO frequency over a larger frequency range is required. Furthermore, the frequency/tuning voltage characteristic curve should advantageously have the flattest possible course, with the widest possible voltage variation range of the linear portion of the frequency/tuning voltage characteristic curve. This is because in that case undesirable tuning voltage fluctuations such as noise do not overly affect the VCO frequency. In the above-described circuits in accordance with U.S. Pat. No. 3,452,289, this characteristic curve can be flattened by negative feedback of the current of the lower differential amplifier.

In the book entitled "Halbleiter-Schaltungstechnik" [Semiconductor Circuitry] by Tietze and Schenk, seventh edition, 1985, FIG. 12.38 on page 337 is a circuit diagram of a four-quadrant slope multiplier. Aside from an additional circuit group, this relates to a circuit of the kind known from the above-described U.S. Pat. No. 3,452,289. The above-described first and second signal input are combined into one signal input, and the aforementioned negative current feedback is attained since instead of the constant current source connected to the emitter terminals of both transistors of the lower differential amplifier transistor pair, a separate constant current source is provided for each of these emitter terminals, and the emitter terminals are not connected directly but instead through a coupling resistor.

It is accordingly an object of the invention to provide a monolithically integratable voltage controlled oscillator, which overcomes the heretofore-mentioned disadvantages of the heretofore-known devices of this general type, which has an output frequency that depends linearly on the tuning voltage over the widest possible range, and in which the width of the tuning voltage range corresponding to this frequency range can be predetermined.

With the foregoing and other objects in view there is provided, in accordance with the invention, a phase shifter oscillator assembly, comprising a phase shifter oscillator having a voltage-controllable output frequency and including at least first and last fundamental circuits, each of the fundamental circuits including an amplifier adding circuit having a symmetrical first input, a symmetrical second input, and an output, a control input connected to the control input of all of the other fundamental circuits for receiving a tuning potential for varying a ratio of an amplification operative between the symmetrical first input and the output of the amplifier adding circuit to an amplification operative between the symmetrical second input and the output of the amplifier adding circuit, a reference input for receiving a respective reference potential, a symmetrical first input of the fundamental circuit including a first input pair with a first non-inverting input and a first inverting input, a symmetrical second input of the fundamental circuit forming the symmetrical second input of the amplifier adding circuit and including a second input pair with a second non-inverting input and a second inverting input, a symmetrical signal output including an output pair with a non-inverting signal output and an inverting signal output, and a symmetrical timing element having an input connected to the symmetrical first input of the fundamental circuit and having an output forming the symmetrical first input of the amplifier adding circuit; the first input pair of each of the fundamental circuits being associated with the output pair of only one other of the fundamental circuits, the first non-inverting input of the first fundamental circuit being connected to the non-inverting signal output of one other of the last fundamental circuits, and the first inverting input of the first fundamental circuit being connected to the inverting signal output of the same other fundamental circuit, the non-inverting signal output of the first fundamental circuit being connected to the first inverting input of the last fundamental circuit and to the second inverting inputs of all of the fundamental circuits, and the inverting signal output of the first fundamental circuit being connected to the first non-inverting input of the last fundamental circuit and to the second non-inverting inputs of all of the fundamental circuits; at least one of the signal outputs of at least one of the fundamental circuits forming a signal output of the phase shifter oscillator.

In accordance with another feature of the invention, each of the fundamental circuits includes first through fifth transistors each having emitter, collector and base terminals; and in each of the fundamental circuits: the timing element as a first output terminal connected to the base terminal of the first transistor and a second output terminal connected to the base terminal of the second transistor; the emitter terminals of the first and the second transistors are connected together to the collector terminal of the third transistor: the base terminal of the third transistor forms the control input; the second non-inverting input is connected to the base terminal of the fourth transistor, the second inverting input is connected to the base terminal of the fifth trantsistor; the emitter terminals of the fourth and the fifth transistors are connected together to the collector terminal of the sixth transistor; the base terminal of the sixth transistor forms the reference input; the collector terminals of the first and the fourth transistors are connected together to the inverting signal output, a first resistor connects the collector terminals of the first and the fourth transistors to a first supply potential; the collector terminals of the second and t fifth transistors are connected together to the non-inverting signal output, a second resistor connects the collector terminals of the second and the fifth transistors to the first supply potential; a first constant current source connects the emitter terminal of the third transistor to a second supply potential; a coupling resistor is connected between the emitter terminal of the third transistor and the emitter terminal of the sixth transistor; and a second constant current source connects the emitter terminal of the sixth transistor to the second supply potential.

In accordance with a further feature of the invention, the timing element is a differential amplifier circuit including seventh and eighth transistors each having emitter, collector and base terminals: the base terminal of the seventh transistor and the base terminal of the eighth transistor each form one input terminal of the symmetrical input of the timing element; the emitter terminals of the seventh and the eighth transistors are interconnected, a third constant current source connects the emitter terminals of the seventh and the eighth transistors to a supply potential; a third resistor connects the collector terminal of the seventh transistor to another supply potential, a fourth resistor connects the collector terminal of the eighth transistor to the other supply potential; and the collector terminals of the seventh and the eighth transistors each form one of the output terminals of the symmetrical output of the timing element.

In accordance with an added feature of the invention, there is provided a symmetrical amplifier connected downstream of the signal output of the first fundamental circuit.

In accordance with an additional feature of the invention, the phase shifter oscillator is a first phase shifter oscillator, and there are provided at least a second phase shifter oscillator forming a ring oscillator with the first phase shifter oscillator, the signal output of the first fundamental circuit of the first phase shifter oscillator being connected to the symmetrical first input of the last fundamental circuit of the second phase shifter oscillator and being connected to the symmetrical second signal input of all of the fundamental circuits of the second phase shifter oscillator; the inverting signal output of the first fundamental circuit of the first phase shifter oscillator being connected to the first non-inverting input of the last fundamental circuit and to the second non-inverting inputs of all of the fundamental circuits of the second phase shifter oscillator, and the non-inverting signal output of the first fundamental circuit of the first phase shifter oscillator being connected to the first inverting input of the last fundamental circuit and to the second non-inverting inputs of all of the fundamental circuits of the second phase shifter oscillator.

In accordance with yet another feature of the invention, the inverting inputs of all of the fundamental circuits are connected to a common reference potential.

In accordance with a concomitant feature of the invention, the signal outputs of the fundamental circuits each provide mutually phase-shifted output signals of the phase shifter oscillators.

Other features which are considered as characteristic for the invention are set forth in the appended claims.

Although the invention is illustrated and described as embodied in a monolithically integratable phase shifter VCO, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
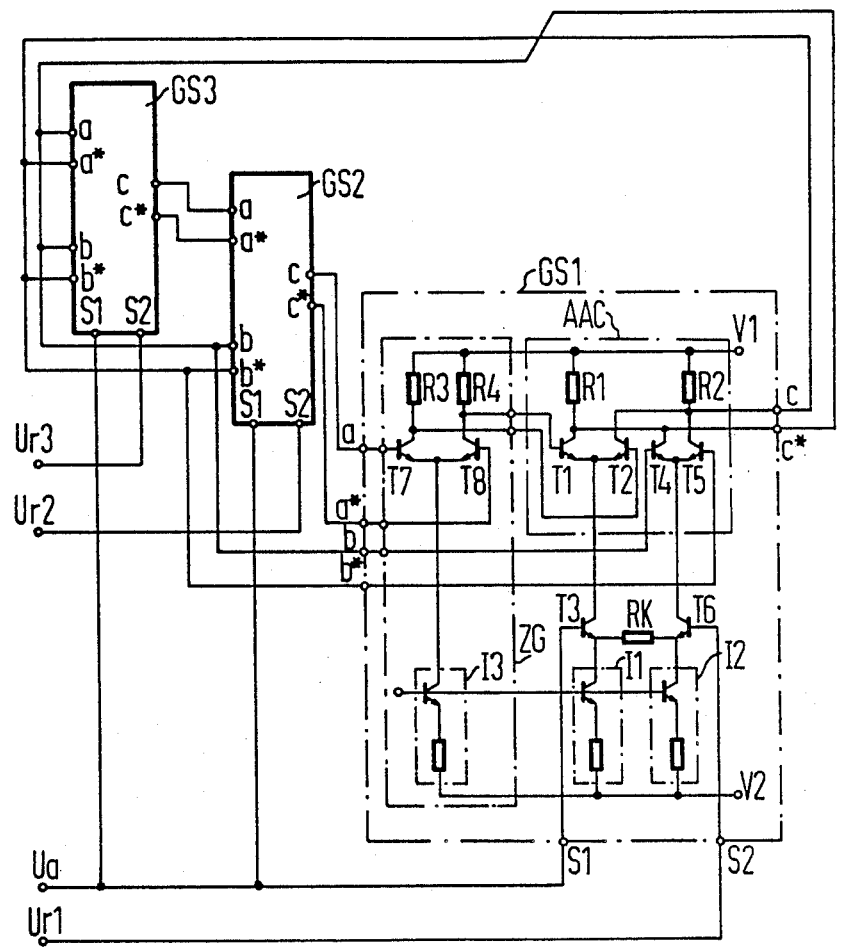
Figure 3:
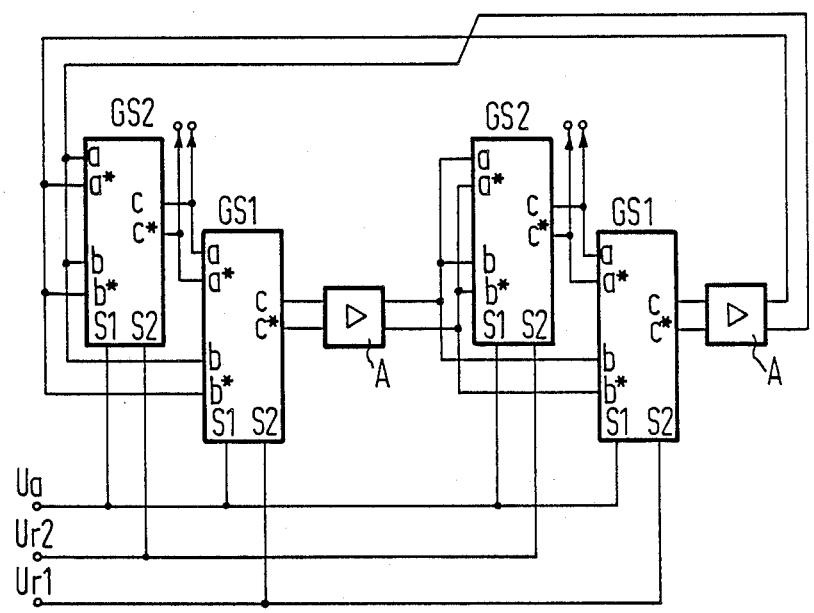

FIG. 1 is a schematic circuit diagram of a specialized embodiment of the invention, which is formed of three fundamental circuits GS1, GS2, GS3;

FIG. 2 is a graph of a frequency/tuning voltage relationship to be sought for wide band PLL circuits, which can be attained with the aid of circuits according to FIG. 1 by corresponding graduation of three reference voltages Uref1, Uref2, Uref3 and coupling resistors RK of the three fundamental circuits GS1, GS2 and GS3; and FIG. 3 is a circuit diagram of an embodiment of an oscillator according to the invention that permits operation at lower frequencies, without narrowing the relative adjusting range, and which moreover furnishes output signals of the same frequency with different fixed phase positions.

Referring now to the FIGS. of the drawing in detail and first, particularly, to FIG. 1 thereof, there is seen a specialized embodiment of the invention including a phase shifter oscillator with a voltage-controllable output frequency, formed of fundamental circuits GS1, GS2, GS3 . . . , each having a respective symmetrical first input a, a*, a symmetrical second input b, b*, a control input S1, a reference input S2, and a symmetrical signal output c, c*. The first input a, a* forms the input of a symmetrical timing element ZG. The output of this timing element ZG is connected to the symmetrical first input of an amplifier adding circuit AAC and the symmetrical second input b, b* of each fundamental circuit GS1, GS2, ... forms the second input of this amplifier adding circuit AAC. The reference input S2 of each fundamental circuit GS1, . . . can be acted upon by a reference potential and the control input S1 of each fundamental circuit GS1, GS2, . . . can be acted upon with a tuning potential, for varying a ratio of the amplification operative between the first input of the amplifier adding circuit AAC and its output to the amplification operative between the second input of the amplifier adding circuit AAC and its output. The phase shifter oscillator includes at least two of the fundamental circuits GS1, GS3. A first non-inverting input a as well as a first inverting input a* of each fundamental circuit are connected with the two signal outputs c, c* of another fundamental circuit in such a manner that precisely one output pair c, c* is associated with each of the aforementioned input pairs a, a*. It can be seen that the first non-inverting input a is connected to a signal output c and the first inverting input a* is connected to the corresponding output c* carrying the inverting output signal. In order to generate a 180° phase jump, the signal output c of the first fundamental circuit GS1 only is connectable to the first inverting signal input a* of the final fundamental circuit GS3 as well as to the second inverting signal input b* of the fundamental circuit GS1, . . . of the phase shifter oscillator. Similarly, the output c* of the first fundamental circuit GS1 carrying the inverting output signal, is connected to the first non-inverting input a of the final fundamental circuit GS3 as well as to the second non-inverting input b of each of the fundamental circuits GS1, GS2, . . . of the phase shifter oscillator. The first control inputs S1 of all of the fundamental circuits GS1, GS2, . . . are interconnected and can be acted upon by a tuning potential Ua. The reference input S2 of each fundamental circuit GS1, GS2, . . . can be acted upon by a respective reference potential Ur1, Ur2, Ur3, . . . At least one signal output c, c* of at least one fundamental circuit GS1, GS2, . . . is provided as the signal output of the phase shifter oscillator. One advantage of an oscillator according to the invention is the complete integratability of the circuit, with a wide bandwidth.

In the embodiment shown as an example in FIG. 1, three fundamental circuits GS1, GS2 and GS3 are provided, each having internal circuits which should be identical. Each fundamental circuit GS1, GS2, GS3 is provided with a first non-inverting input a, a first inverting input a*, a second non-inverting input b, and a second inverting input b*, a first control input S1, a reference input S2, a signal output c carrying the non-inverted signal and an output c* carrying the inverted signal. The first non-inverting input a forms the first input of a symmetrical timing element ZG and the first inverting input a* forms the second input of this timing element ZG. A first output of this timing element ZG is connected to the base terminal of a first transistor T1 and a second output of this timing element ZG is connected to the base terminal of a second transistor T2. The emitter terminal of the first transistor T1 and the emitter terminal of the second transistor T2 are connected together to the collector terminal of a third transistor T3. The base terminal of this third transistor T3 forms the control input S1 of the corresponding fundamental circuit GS1, . . . The second non-inverting input b of each fundamental circuit GS1, GS2, GS3 . . . is respectively connected to the base terminal of a fourth transistor T4 and the second inverting input b* is connected to the base terminal of a fifth transistor T5. The emitter terminal of the fourth transistor T4 and the emitter terminal of the fifth transistor T5 are connected together to the collector terminal of a sixth transistor T6.

The base terminal of this sixth transistor T6 forms the reference input S2 of the respective fundamental circuit GS1, GS2, GS3 . . . The collector terminals of the first and fourth transistors T1, T4 are connected together to the output c* carrying the inverted output signal of the corresponding fundamental circuit CS and they are also connected together through a first resistor R1 to a first supply potential V1. The collector terminals of the second and fifth transistors T2, T5 are connected together to the signal output c of the corresponding fundamental circuits GS1, ... and they are also connected together through a second resistor R2 to the first supply potential V1. The emitter terminal of the third transistor T3 is connected through a first constant current source I1 to a second supply potential V2. The emitter terminal of the third transistor T3 is connected through a coupling resistor RK with the emitter terminal of the sixth transistor T6. The emitter terminal of the sixth transistor T6 is connected through a second constant current source I2 to the second supply potential V2.

The timing element ZG provided in FIG. 1 is a differential amplifier circuit which delays the input signal due to the signal transit time constant thereof. In this case, the base terminal of a seventh transistor T7 and the base terminal of an eighth transistor T8 each form one input terminal of the symmetrical input of the timing element ZG.

The emitter terminals of the seventh and eighth transistors T7, T8 are connected together through a third constant current source I3 to a supply potential, in particular to the second supply potential V2. The collector terminal of the seventh transistor T7 and the collector terminal of the eighth transistor T8 are each connected through a respective third resistor R3 and fourth resistor R4 to another supply potential, in particular the first supply potential V1. Each of these collector terminals forms one signal output of the timing element ZG.

In order to increase the delay time, the signal outputs of the timing element ZG can be loaded, especially by capacitors disposed parallel to the respective load. In particular, a timing element formed of a plurality of timing elements of the above-described type can be connected together in series for this purpose. Moreover, the timing element ZG can be assembled from any arbitrary delay circuit, for example an RC combination In FIG. 1, the constant current sources I1, I2, I3, which can be assembled arbitrarily, are each shown as a transistor circuit, with the base of the respective transistor acted upon by a constant potential, the collector of the respective transistor forming the current input of the respective current source, and the emitter of the respective transistor being connected through a resistor to the current output of the respective current source.

Due to the addition of two phase-shifted signals, poorly defined signal edges are produced. In order to obtain a rectangular output signal with clearly defined edges, one of the fundamental circuits (GS1, ... ) of one oscillator can be connected upstream of a symmetrical comparator amplifier (A), such as a differential amplifier operating as a switch, as shown in FIG. 3.

If the inverting inputs (a*, b*) of all the fundamental circuits (GS1, GS2, ... ) of one oscillator are connected to a common reference potential, then an oscillator of the type according to the invention is obtained for a symmetrical signal.

If the tuning voltage Ua in the circuit shown in FIG. 1 is high as compared with all of the reference voltages Ur1, Ur2, ..., then a weighting factor $X_1$ of the signal fed in at the first input a, a*, which is delayed by a timing element ZG in each of the fundamental circuits GS1, GS2, ... is high as compared with the weighting factor $X_2$ of the signal fed in at the second input b, b*. Since all of the timing elements are operative, the ring signal transit time $T_n$ in the oscillator in this case is maximal, which leads to a minimal VCO frequency. If the tuning voltage Ua is low as compared with all of the reference voltages Ur1, Ur2, ..., so that the coefficient $X=X_1/X_2$ formed from the weighting factors $X_1$ and $X_2$ is minimal, then the ring signal transit time $T_n$ in the oscillator is minimal and the VCO frequency is maximal.

The variation of the weighting factor coefficients X as a function of the tuning voltage Ua can be influenced by the coupling resistor RK. The smaller the coupling resistor RK, the more the weighting factor coefficient X varies, given an identical variation of the tuning voltage.

At a minimal ring signal transit time $T_1$ and a maximal ring signal transit time $T_n = nT_1$, where n may be an arbitrary real number greater than 1, the inverse value of the oscillator frequency is $1/f_{VCO} = 2(T_1 + X(T_n - T_1))$ or $1/f_{VCO} = 2T_1(1 + (n-1)X)$. Accordingly, a hyperbolic relationship exists between the variation of the frequency $f_{VCO}$ and the variation of the weighting factor coefficient X.

FIG. 2 illustrates the relationship between the tuning potential Ua and the output frequency $f_{VCO}$, which can be attained with a circuit according to FIG. 1 by selecting special values for the reference potentials Ur1, Ur2 and Ur3 and special resistances for the coupling resistors RK of the fundamental circuits GS1, GS2 and GS3. In this case the slope of the frequency/tuning potential characteristic curve is constant over a wide frequency range. The broken lines in each case show the course of the characteristic curve that would become established if the oscillator were to include only one of the fundamental circuits GS1, GS2 or GS3. It is apparent in this case that at higher frequencies, a greater voltage difference is necessary to attain the same frequency difference than at lower frequencies, which can be ascribed to the aforementioned hyperbolic relationship between the frequency variation of the oscillator and the variation of the weighting factor coefficient X. The corresponding adaptation of the characteristic curve is attained, with otherwise identical fundamental circuits GS1, GS2 and GS3, by providing that the coupling resistor RK in the fundamental circuit GS1 is larger than in the fundamental circuit GS2, and that the coupling resistor RK in the fundamental circuit GS3 in turn is smaller than in the fundamental circuit GS2. The reference potentials Ur1, Ur2, ..., which are provided for acting upon these various reference inputs S2 of the various fundamental circuits GS1, GS2, ... are logically selected in such a way that the maximal control voltage $(Ua - Ur1)_{max}$ of the linear portion of the frequency/tuning voltage characteristic curve of the first fundamental circuit GS1 is virtually equal to the minimal control voltage $(Ua - Ur2)_{min}$ of the linear portion of the frequency/tuning voltage characteristic curve of the second fundamental circuit GS2, and that the characteristic curves of possible further fundamental circuits GS3, ... are augmented in the same manner in order to produce a linear frequency/tuning potential characteristic curve of the total oscillator.

FIG. 3 illustrates a specialized embodiment of an oscillator according to the invention, with which the frequency range of the oscillator for given fundamental circuits in which the signal transit times are dictated by technology and are not vriable in wide ranges, can be shifted toward low frequencies. The functioning of the circuit shown in FIG. 3 is based on the principle of reducing the oscillator frequency by connecting a plurality of oscillator stages one after another to form a multi-stage phase shifter oscillator, as described in the above-cited book by J. L. Stewart, "Theorie and Entwurf elektrischer Netzwerke" [Theory and Design of Electrical Networks], Berliner Union, Stuttgart, 1958, on pages 379 and 380 and explained using a three-stage phase shifter oscillator in vacuum-tube technology as an example. A particular advantage of such circuits, with the use of identical oscillator stages, is that an output signal of identical frequency can be picked up at the output of each oscillator stage, and these output signals are in a fixed phase relationship with one another. For example, if n is the number of identical oscillator stages connected in series, then the output signal of one oscillator stage is shifted in phase by 180°/n with respect to the preceding and following stages. The output signal is then phase-shifted on either side with respect to the inverting output signals of the oscillator stages by 180°+180°/n, or 180°−180°/n, respectively.

A particular effect of a circuit according to FIG. 3 to be noted is that by identical triggering of the control and reference inputs of the various oscillator stages, which are described above for instance, a reduction of the oscillator frequency does not worsen the ratio between the maximal and minimal oscillator frequency that can be set with the tuning voltage Ua. FIG. 3 in particular shows a phase shifter oscillator formed of phase shifter oscillators as defined above, wherein at east two phase shifter oscillators form a ring oscillator in such a manner that the output c, c* of the first fundamental circuit GS1 of one phase shifter oscillator is connected to the symmetrical first input a, a* of another phase shifter oscillator and is also connected to the symmetrical second signal input b, b* of all of the fundamental circuits GS1, GS2, . . . of this other phase shifter oscillator. The output c* carrying the inverted signal is connectable only once to the non-inverting inputs a, b, and the output c carrying the non-inverting signal is connected only once to the inverting inputs a*, b*. The signal outputs of the various fundamental circuits GS1, GS2, . . . are each provided for furnishing output signals of the phase shifter oscillator which are phase-offset with respect to one another.

The foregoing is a description corresponding in substance to German Application No. P 37 39 210.7, dated Nov. 19, 1987, the International priority of which is being claimed for the instant application, and which is hereby made part of this application.

We claim:

1. Phase shifter oscillator assembly, comprising a phase shifter oscillator having a voltage-controllable output frequency and including at least first and last fundamental circuits,
   each of said fundamental circuits including:
   an amplifier adding circuit having a symmetrical first input, a symmetrical second input, and an output,
   a control input connected to said control inputs of all of the other fundamental circuits for receiving a tuning potential for varying a ratio of an amplification operative between said symmetrical first input and said output of said amplifier adding circuit to an amplification operative between said symmetrical second input and said output of said amplifier adding circuit,
   a reference input for receiving a respective reference potential,
   a symmetrical first input of said fundamental circuit including a first input pair with a first non-inverting input and a first inverting input,
   a symmetrical second input of said fundamental circuit forming said symmetrical second input of said amplifier adding circuit and including a second input pair with a second non-inverting input and a second inverting input,
   a symmetrical signal output including an output pair with a non-inverting signal output and an inverting signal output, and
   a symmetrical timing element having an input connected to said symmetrical first input of said fundamental circuit and having an output forming said symmetrical first input of said amplifier adding circuit;
   said first input pair of each of said fundamental circuits being associated with said output pair of only one other of said fundamental circuits, said first non-inverting input of said first fundamental circuit being connected to said non-inverting signal output of one other of said fundamental circuits, and said first inverting input of said first fundamental circuit being connected to said inverting signal output of said same other fundamental circuit,
   said non-inverting signal output of said first fundamental circuit being connected to said first inverting input of said last fundamental circuit and to said second inverting inputs of all of said fundamental circuits, and said inverting signal output of said first fundamental circuit being connected to said first non-inverting input of said last fundamental circuit and to said second non-inverting inputs of all of said fundamental circuits;
   at least one of said signal outputs of at least one of said fundamental circuits forming a signal output of the phase shifter oscillator.

2. Phase shifter oscillator assembly according to claim 1, wherein each of said fundamental circuits includes first through sixth transistors each having emitter, collector and base terminals; and in each of said fundamental circuits: said timing element has a first output terminal connected to the base terminal of said first transistor and a second output terminal connected to the base terminal of said second transistor; the emitter terminals of said first and said second transistors are connected together to the collector terminal of said third transistor; the base terminal of said third transistor forms said control input; said second non-inverting input is connected to the base terminal of said fourth transistor, said second inverting input is connected to the base terminal of said fifth transistor; the emitter terminals of said fourth and said fifth transistors are connected together to the collector terminal of said sixth transistor; the base terminal of said sixth transistor forms said reference input; the collector terminals of said first and said fourth transistors are connected together to said inverting signal output, a first resistor connects the collector terminals of said first and said fourth transistors to a first supply potential; the collector terminals of said second and said fifth transistors are connected together to said non-inverting signal output, a second resistor connects the collector terminals of said second and said fifth transistors to the first supply potential; a first constant current source connects the emitter terminal of said third transistor to a second supply potential; a coupling resistor is connected between the emitter terminal of said third transistor and the emitter terminal of said sixth transistor; and a second constant current source connects the emitter terminal of said sixth transistor to the second supply potential.

3. Phase shifter oscillator assembly according to claim 2, wherein said timing element is a differential amplifier circuit including seventh and eighth transistors each having emitter, collector and base terminals; the base terminal of said seventh transistor and the base terminal of said eighth transistor each form one input terminal of said symmetrical input of said timing element: the emitter terminals of said seventh and said eighth transistors are interconnected, a third constant current source connects the emitter terminals of said seventh and said eighth transistors to a supply potential; a third resistor connects the collector terminal of said seventh transistor to another supply potential, a fourth resistor connects the collector terminal of said eighth transistor to the other supply potential; and the collector terminals of said seventh and said eighth transistors each form one of said output terminals of said symmetrical output of said timing element.

4. Phase shifter oscillator assembly according to claim 1, including a symmetrical amplifier connected downstream of said signal output of said first fundamental circuit.

5. Phase shifter oscillator assembly, according to claim 1, wherein said phase shifter oscillator is a first phase shifter oscillator, and including at least a second phase shifter oscillator forming a ring oscillator with said first phase shifter oscillator, said signal output of said first fundamental circuit of said first phase shifter oscillator being connected to said symmetrical first input of said last fundamental circuit of said second phase shifter oscillator and being connected to said symmetrical second signal inputs of all of said fundamental circuits of said second phase shifter oscillator; said inverting signal output of said first fundamental circuit of said first phase shifter oscillator being connected to said first non-inverting input of said last fundamental circuit and to said second non-inverting inputs of all of said fundamental circuits of said second phase shifter oscillator, and said non-inverting signal output of said first fundamental circuit of said first phase shifter oscillator being connected to said first inverting input of said last fundamental circuit and to said second non-inverting inputs of all of said fundamental circuits of said second phase shifter oscillator.

6. Phase shifter oscillator assembly according to claim 1, wherein said inverting inputs of all of said fundamental circuits are connected to a common reference potential.

7. Phase shifter oscillator assembly according to claim 5, wherein said signal outputs of said fundamental circuits each provide mutually phase-shifted output signals of the phase shifter oscillators.

* * * * *